US011101635B2

(12) United States Patent
Kwon et al.

(10) Patent No.: US 11,101,635 B2
(45) Date of Patent: Aug. 24, 2021

(54) PROTECTIVE RELAY TEST EQUIPMENT OPERATION DEVICE AND METHOD

(71) Applicant: KOREA ELECTRIC POWER CORPORATION, Naju-si (KR)

(72) Inventors: Young-Hun Kwon, Daejeon (KR); Ki-Seob YuN, Daejeon (KR); Guk-Tae Kim, Daejeon (KR)

(73) Assignee: KOREA ELECTRIC POWER CORPORATION, Naju-si (KR)

( * ) Notice: Subject to any disclaimer, the term of this patent is extended or adjusted under 35 U.S.C. 154(b) by 238 days.

(21) Appl. No.: 16/490,879

(22) PCT Filed: Aug. 18, 2017

(86) PCT No.: PCT/KR2017/008993
§ 371 (c)(1),
(2) Date: Sep. 3, 2019

(87) PCT Pub. No.: WO2018/164330
PCT Pub. Date: Sep. 13, 2018

(65) Prior Publication Data
US 2020/0021100 A1 Jan. 16, 2020

(30) Foreign Application Priority Data
Mar. 10, 2017 (KR) .......................... 10-2017-0030663

(51) Int. Cl.
*G01R 31/327* (2006.01)
*H02H 3/10* (2006.01)
*H02H 1/00* (2006.01)

(52) U.S. Cl.
CPC ........... *H02H 3/10* (2013.01); *G01R 31/3278* (2013.01); *H02H 1/0007* (2013.01)

(58) Field of Classification Search
CPC .... H02H 3/10; H02H 1/0007; G01R 31/3278; G01R 31/333; G01R 31/3333
See application file for complete search history.

(56) References Cited

U.S. PATENT DOCUMENTS 6,815,955 B1 * 11/2004 O'Neal, III ........ G01R 31/3277
324/424
7,199,587 B2 * 4/2007 Hurwicz ............ G01R 31/3272
324/424

(Continued)

FOREIGN PATENT DOCUMENTS

JP 9-127172 A 5/1997
JP 2000-338157 A 12/2000

(Continued)

*Primary Examiner* — Scott Bauer
(74) *Attorney, Agent, or Firm* — Foundation Law Group, LLP

(57) ABSTRACT

A protective relay test equipment operation device according to an embodiment of the present invention may comprise: a switch unit for, upon reception of a trip signal or a close signal from a protective relay, changing an electrical connection state between a first port configured to be electrically connected to test equipment that generates a test signal and a second port configured to be electrically connected to the protective relay; a measurement unit for measuring a voltage and a current between the first port and the second port during a test period in which an operation time point of the switch unit is a start time point or an end time point; and a calculation unit for calculating a plurality of time point-specific impedance values within the test period according to a measurement result of the measurement unit.

12 Claims, 9 Drawing Sheets

(56) References Cited

U.S. PATENT DOCUMENTS

| | | | |
|---|---|---|---|
| 8,768,563 B2 * | 7/2014 | Nitzberg | B60L 53/18 |
| | | | 701/31.6 |
| 9,366,711 B2 * | 6/2016 | Klapper | G01R 31/327 |
| 10,535,482 B2 * | 1/2020 | Brandt | G01R 31/3278 |
| 2002/0121900 A1 * | 9/2002 | Marple | G01R 31/66 |
| | | | 324/424 |
| 2003/0042906 A1 * | 3/2003 | Lutz | G01R 31/3278 |
| | | | 324/418 |
| 2007/0115604 A1 * | 5/2007 | Zettel | G01R 31/3278 |
| | | | 361/160 |
| 2012/0256652 A1 * | 10/2012 | Starkell | G01R 31/3272 |
| | | | 324/764.01 |

FOREIGN PATENT DOCUMENTS

| | | |
|---|---|---|
| JP | 2001-289896 A | 10/2001 |
| JP | 2009-171722 A | 7/2009 |
| JP | 2011-101453 A | 5/2011 |
| KR | 10-1998-0073532 A | 11/1998 |
| KR | 10-2004-0024990 A | 3/2004 |
| KR | 10-2004-0104442 A | 12/2004 |
| KR | 10-2012-0002035 A | 1/2012 |
| KR | 10-1505003 B1 | 3/2015 |
| KR | 10-1575806 B1 | 12/2015 |
| KR | 10-1673819 B1 | 11/2016 |
| KR | 20160143275 A * | 12/2016 |

\* cited by examiner

【FIG. 1】
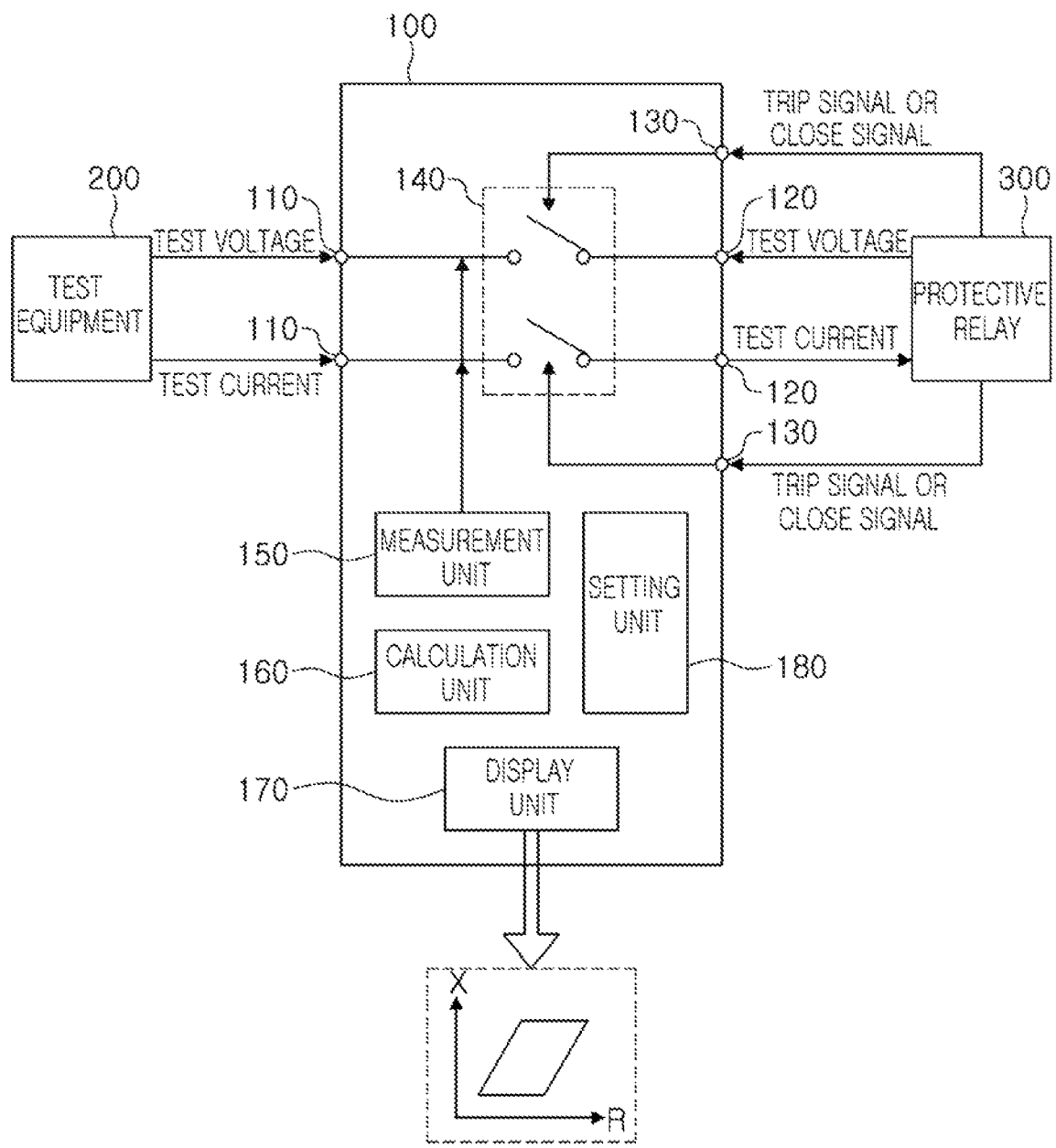

【FIG. 2a】
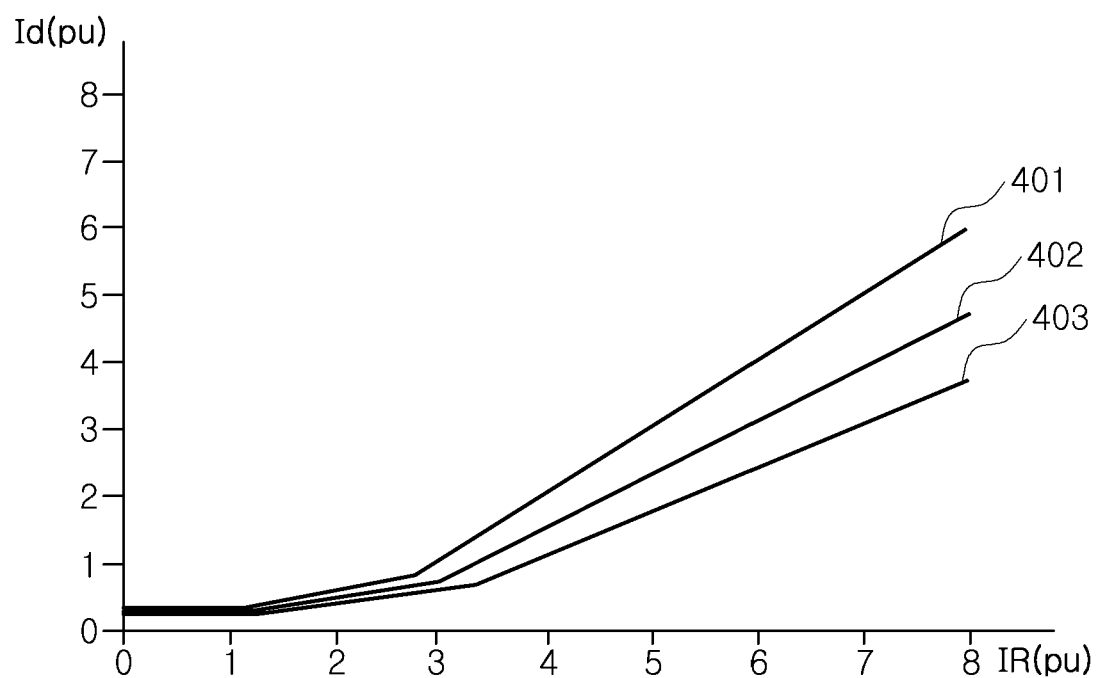

【FIG. 2b】

【FIG. 2c】
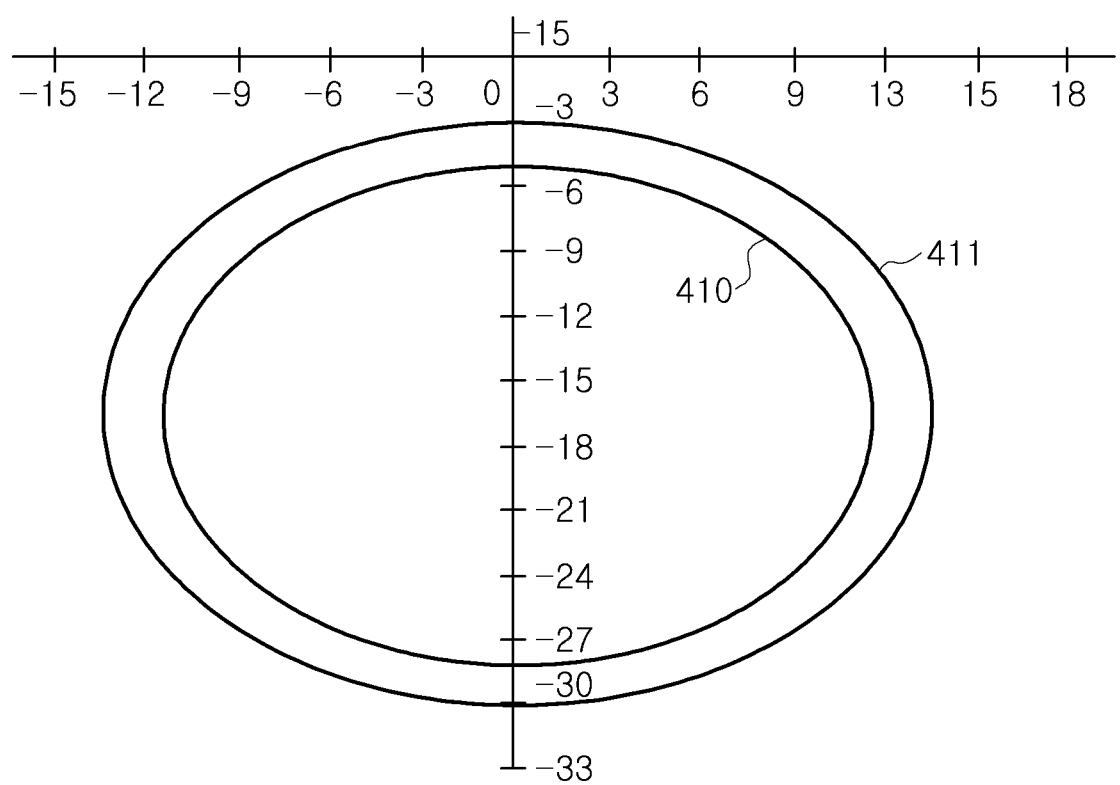

【FIG. 3a】
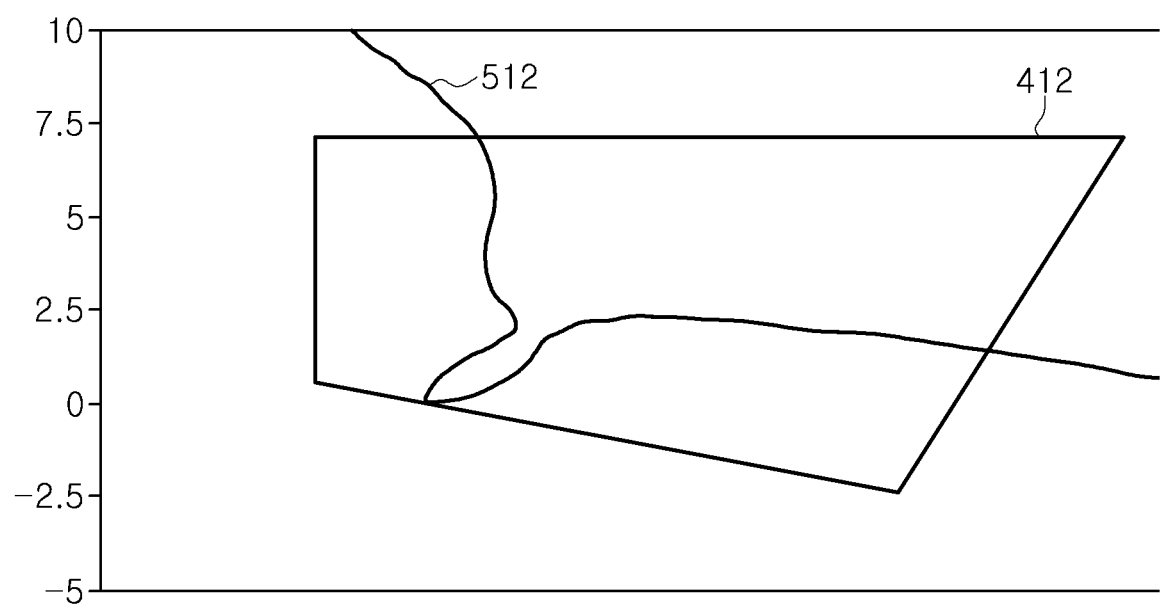

[FIG. 3b]
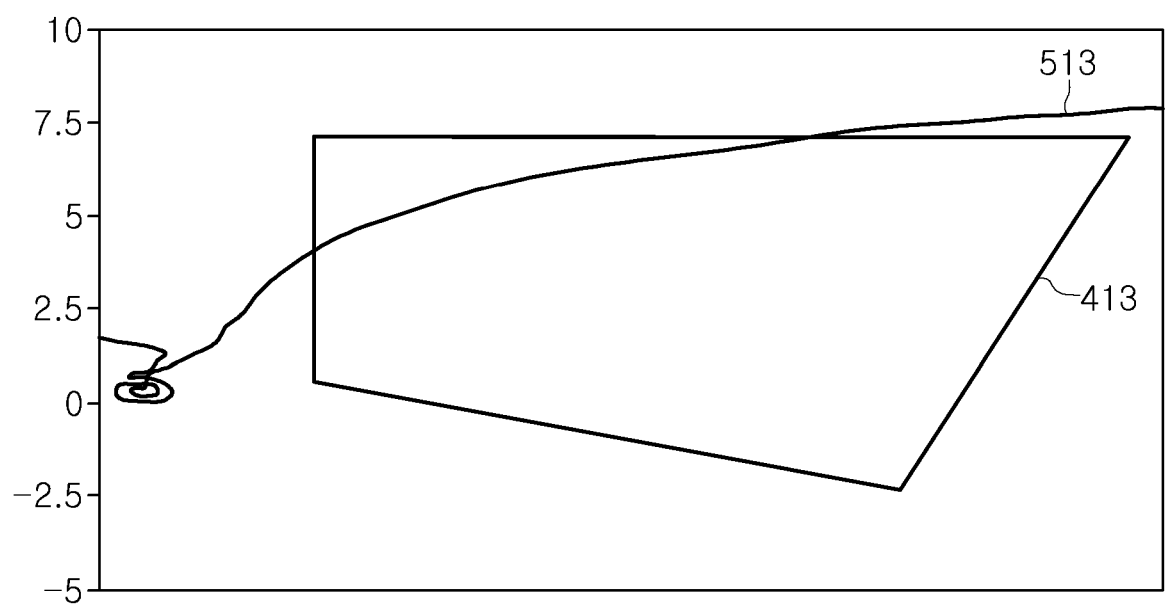

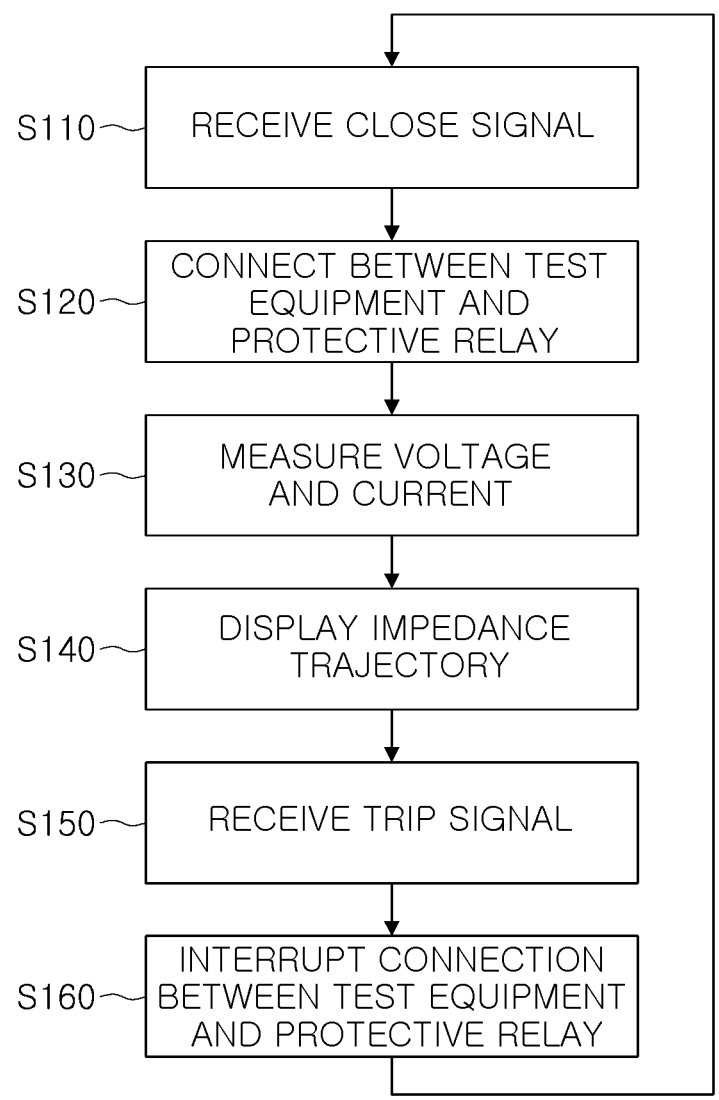
[FIG. 4]

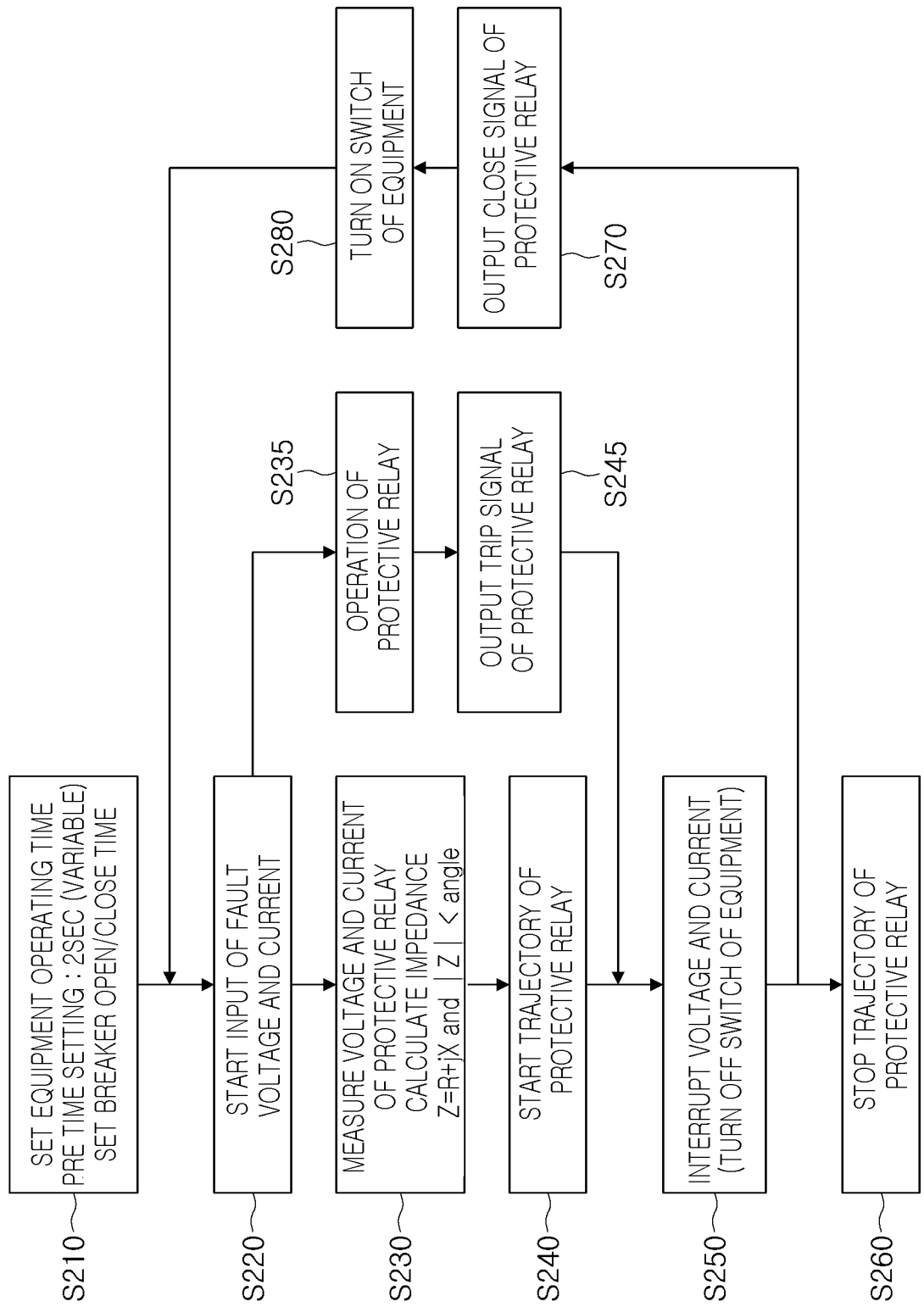
[FIG. 5]

[FIG. 6]
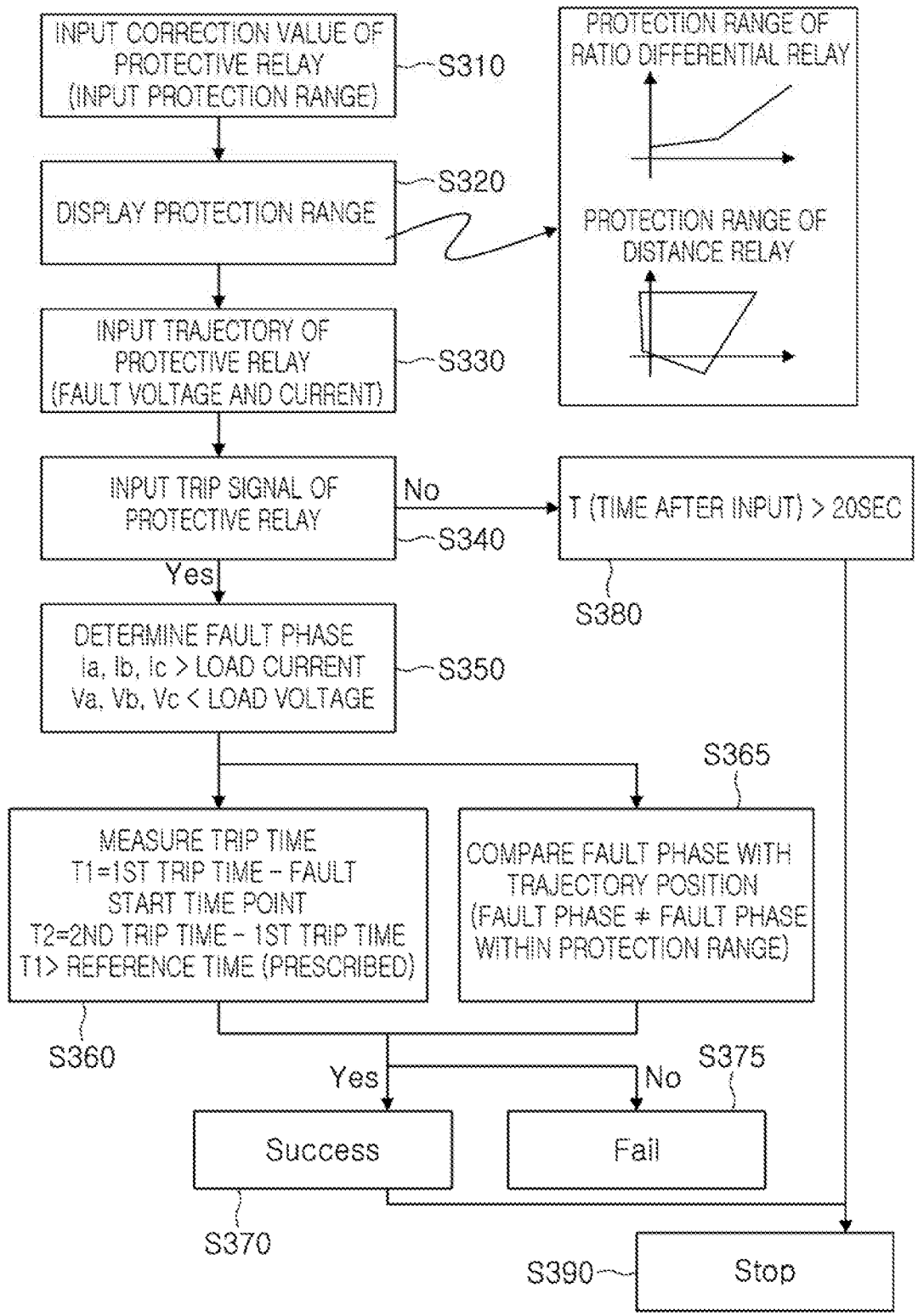

PROTECTIVE RELAY TEST EQUIPMENT OPERATION DEVICE AND METHOD

CROSS REFERENCE TO RELATED PATENT APPLICATION(S)

This application claims the benefit under 35 U.S.C. Section 371, of PCT International Application No. PCT/KR2017/008993, filed on Aug. 18, 2018, which claimed priority to Korean Patent Application No. KR10-2017-0030663, filed on Mar. 10, 2017, the disclosures of which are hereby incorporated by the references.

TECHNICAL FIELD

The present disclosure relates to protective relay test equipment operation device and method.

BACKGROUND ART

A protective relay test equipment may generate a test signal by simulating a type of voltage and current flowing into a protective relay when the protective relay operates in the field and inject the generated test signal into the protective relay to test whether or not the protective relay is malfunctioning.

The protective relay test equipment needs to use a separate program for each type of protective relay to analyze operating data of the protective relay.

Since many types of protective relays are often installed in the field, the protective relay test equipment requires various programs when used in the field. However, when various programs are not secured in advance, a test schedule may be delayed.

DISCLOSURE

Technical Problem

An aspect of the present disclosure is to provide protective relay test equipment operation device and method capable of easily securing operating data of a protective relay by interposing a test performed between a test equipment and the protective relay.

Technical Solution

According to an aspect of the present disclosure, a protective relay test equipment operation device includes a switch unit changing an electrical connection state between a first port configured to be electrically connected to the test equipment generating a test signal and a second port configured to be electrically connected to the protective relay as according to a trip signal or a close signal received from the protective relay; a measurement unit measuring a voltage and a current between the first port and the second port during a test period in which an operation time point of the switch unit is a start time point or an end time point; and a calculation unit calculating impedance for each of a plurality of time points within the test period according to the measurement result of the measurement unit.

The device may further include a display unit displaying an impedance trajectory by displaying the impedances calculated by the calculation unit in the order of the plurality of time points on a coordinate having a resistance component axis and a reactance component axis.

The display unit may display the impedance trajectory together with a protection range of the protective relay, and the calculation unit may generate performance information of the protective relay based on impedance of a time point at which the impedance trajectory meets the protection range.

The calculation unit may compare impedance of a time point of the plurality of time points at which the voltage or the current falls within an operating range of the protective relay with reference impedance, and generate performance information of the protective relay based on the reference impedance comparison result.

The device may further include a setting unit receiving type information of the protective relay and setting the operating range of the protective relay and the reference impedance based on the type information.

The calculation unit may compare a period from a time point at which the switch unit receives the trip signal or the close signal to a time point at which the voltage or the current falls within an operating range of the protective relay with a first reference period, and generate correction operation performance information of the protective relay based on the first reference period comparison result.

The calculation unit may compare a period from the time point at which the switch unit receives the trip signal or the close signal to a time point at which the switch unit receives an additional trip signal or close signal with a second reference period, and generate delay operation performance information of the protective relay based on the second reference period comparison result.

The device may further include a setting unit receiving type information of the test equipment and setting a length of the first reference period or a length of the second reference period based on the type information.

The device may further include a second switch unit changing an electrical connection state between a third port configured to be electrically connected to the protective relay and the first port as the trip signal or the close signal is received, wherein the second port and the third port may be configured to be connected to different types of connection terminals.

According to another aspect of the present disclosure, a protective relay test equipment operation method may include: receiving a close signal from the protective relay; electrically connecting between the test equipment generating a test signal and the protective relay as the close signal is received; measuring a voltage and a current between the test equipment and the protective relay; generating or displaying an impedance trajectory based on the voltage and the current; receiving a trip signal from the protective relay; and electrically interrupting a signal between the test equipment and the protective relay as the trip signal is received.

The method may further include: calculating a time point or a point at which the impedance trajectory meets a protection range of the protective relay; and generating performance information of the protective relay based on the time point or the point.

The method may further include: receiving type information of the protective relay; and setting the protection range corresponding to the type information.

Advantageous Effects

As set forth above, according to an exemplary embodiment in the present disclosure, since protective relay test equipment operation device and method may easily secure the operating data of the protective relay by interposing the test performed between the test equipment and the protective relay, the device and the method for operating the test equipment of the protective relay may support the test coordinator to smoothly check the performance information on various protective relays.

In addition, since the device and the method for operating the test equipment of the protective relay according to an exemplary embodiment in the present disclosure may reduce a negative effect of the test signal on the operating data of the protective relay in the process of securing the operating data of the protective relay, accurate operating data of the protective relay may be secured.

In addition, the device and the method for operating the test equipment of the protective relay according to an exemplary embodiment in the present disclosure may improve connection compatibility of the protective relay.

DESCRIPTION OF DRAWINGS

FIG. 1 is a diagram illustrating a protective relay test equipment operation device according to an exemplary embodiment in the present disclosure.

FIGS. 2A through 2C are diagrams illustrating protection ranges according to types of protective relays.

FIGS. 3A and 3B are diagrams illustrating protection ranges and impedance trajectories of the protective relay.

FIG. 4 is a flowchart illustrating a protective relay test equipment operation method according to an exemplary embodiment in the present disclosure.

FIG. 5 is a flowchart illustrating an internal operation of the protective relay test equipment operation device according to an exemplary embodiment in the present disclosure.

FIG. 6 is a flowchart illustrating generation of performance information and an impedance trajectory of the protective relay test equipment operation device according to an exemplary embodiment in the present disclosure.

BEST MODE FOR INVENTION

A detailed description of the present disclosure to be described later refers to the accompanying drawings that illustrate, by way of illustration, specific exemplary embodiments in which the present disclosure may be practiced. It should be appreciated that various exemplary embodiments in the present disclosure are different from each other, but need not be mutually exclusive. For example, specific shapes, structures, and characteristics described in the present specification may be implemented in another exemplary embodiment without departing from the spirit and the scope of the present disclosure in connection with an exemplary embodiment. In addition, it should be understood that a position or an arrangement of individual components in each disclosed exemplary embodiment may be changed without departing from the spirit and the scope of the present disclosure. Therefore, a detailed description to be described later should not be construed as being restrictive, and the scope of the present disclosure is defined only by the accompanying claims and their equivalents if appropriate. Similar reference numerals will be used to describe the same or similar functions throughout the accompanying drawings.

Hereinafter, exemplary embodiments in the present disclosure will be described in detail with reference to the accompanying drawings so that those skilled in the art may easily practice the present disclosure.

FIG. 1 is a diagram illustrating a protective relay test equipment operation device according to an exemplary embodiment in the present disclosure.

Referring to FIG. 1, a protective relay test equipment operation device 100 according to an exemplary embodiment in the present disclosure may include at least some of a first port 110, a second port 120, a third port 130, a switch unit 140, a measurement unit 150, a calculation unit 160, a display unit 170, and a setting unit 180, and may intervene in a test that is performed between a test equipment 200 and a protective relay 300.

The first port 110 may be configured to be electrically connected to the test equipment 200 for generating a test signal. The test signal may include a test voltage and a test current, and may include three test voltages and three test currents of different phases. Therefore, the first port 110 may include three connection ports through which a test voltage passes and three connection ports through which a test current passes.

The second port 120 may be configured to be electrically connected to the protective relay 300. The second port 120 may be configured to correspond to the first port 110. For example, the second port 120 may include three connection ports through which a test voltage passes and three connection ports through which a test current passes.

According to a design, the protective relay test equipment operation device 100 may be configured such that a connection terminal of a different type from that of the connection terminal connected to the second port 120 is connected, and may further include a plurality of third ports (not illustrated) configured to be electrically connected to the protective relay 300.

That is, since the connection terminal for connecting the protective relay test equipment operation device 100 to the protective relay 300 may vary according to the type of the protective relay 300, the protective relay test equipment operation device 100 may improve connection compatibility of the protective relay by providing various ports.

The third port 130 may be configured to receive a trip signal or a close signal from the protective relay 300. The trip signal and the close signal may be generated by the protection relay 300 when a test voltage and/or a test current falls within an operating range of the protection relay 300.

The switch unit 140 may change an electrical connection state between the first port 110 and the second port 120 by receiving the trip signal or the close signal from the third port 130.

Accordingly, since the protective relay test equipment operation device 100 may reduce a negative effect of the test signal on the operating data of the protective relay in the process of securing the operating data of the protective relay, accurate operating data of the protective relay may be secured.

For example, the switch unit 140 may include a power semiconductor such as an IGBT or a thyristor, and each terminal of the power semiconductor may be configured to be electrically connected to the first, second, and third ports 110, 120, and 130.

In addition, the switch unit 140 may be configured to electrically connect between the first port 110 and the second port 120 when receiving the close signal, and to interrupt the electrical connection between the first port 110 and the second port 120 when receiving the trip signal. For example, the switch unit 140 may include a circuit that generates a high voltage as the close signal is input and outputs the high voltage to the power semiconductor, and generates a low voltage as the trip signal is input and outputs the low voltage to the power semiconductor.

Meanwhile, when the protective relay test equipment operation device 100 includes a plurality of third ports, the protective relay test equipment operation device 100 may further include a plurality of second switch units (not illustrated) that change an electrical connection state between the first port and the third port as the trip signal or the close signal is received from the plurality of third ports. Accordingly, both the connection comparability of the protective relay and the accuracy of the operating data of the protective relay may be secured.

The measurement unit 150 may measure a voltage and a current between the first port 110 and the second port 120 during a test period based on an operation time point of the switch unit 140. For example, the test time may be from a time point at which the switch unit 140 electrically connects between the first port 110 and the second port 120 to a time point at which the switch unit 140 interrupts the electrical connection between the first port 110 and the second port 120.

For example, the measurement unit 150 may include a transformer that may copy the voltage between the first port 110 and the second port 120 at a predetermined ratio, a current transformer that may copy the current between the first port 110 and the second port 120 at a predetermined ratio, a filter of removing noise from the copied voltage and current, a protective circuit for protecting against a surge voltage or a surge current, and an analog-digital converter (ADC) of converting the copied voltage and current into digital values.

Meanwhile, although FIG. 1 illustrates that the measurement unit 150 measures a voltage and a current of a node between the first port 110 and the switch unit 140, the measurement unit 150 may also measure a voltage and a current of a node between the switch unit 140 and the second port 120.

In addition, the measurement unit 150 may sample the voltage and the current, respectively, between the first port 110 and the second port 120 at a specific sampling frequency (e.g., 2.88 kHz).

The calculation unit 160 may calculate impedances for each of a plurality of time points within the test period according to the measurement result of the measurement unit 150. Since each of the impedances calculated by the calculating unit 160 corresponds to each of the plurality of time points, the calculating unit 160 may detect an impedance trajectory during the test period.

Accordingly, since the protective relay test equipment operation device 100 may easily secure the operating data of the protective relay and may support a test coordinator to smoothly check performance information on various protective relays.

For example, the calculation unit 160 may calculate the impedance by calculating a discrete fourier transform (DFT) and a complex number on each of the voltage and current measured by the measurement unit 150, thereby calculating the magnitude and phase of the impedance. Here, the phase is a value corresponding to a ratio between a resistance component and a reactance component. Meanwhile, the number of points per period of the DFT may be 48, but is not limited thereto, and may be appropriately determined in consideration of precision and calculation speed.

In addition, the calculation unit 160 may generate performance information of the protection relay 300 based on impedance at the time point at which the impedance trajectory meets a protection range of the protection relay 300. The protection range means an impedance range corresponding to the operating range of the protection relay 300. Since the magnitude and phase of the impedance at each point within a boundary of the protection range are different from each other, the calculation unit 160 may compare the magnitude and/or phase of the impedance at the time point with the magnitude and/or phase of reference impedance, and determine whether or not the protection relay 300 operates normally according to the comparison result.

In addition, the calculation unit 160 may compare the impedance when the voltage or current measured during the test period is within the operating range of the protection relay 300 with the reference impedance, and generates the performance information of the protection relay 300 based on the impedance comparison result. If the protective relay 300 operates by detecting an overvoltage or an overcurrent, the operating range may have a voltage range higher than a normal voltage range or a current range higher than a normal current range. Here, a large difference value between the impedance calculated by the calculation unit 160 and the reference impedance may mean that the protective relay 300 detects the overvoltage or the overcurrent late or incorrectly. Therefore, the calculation unit 160 may determine that the performance of the protective relay 300 is excellent as the difference value between the calculated impedance and the reference impedance is smaller.

In addition, the calculation unit 160 may compare a period from the time point at which the switch unit 140 receives the trip signal or the close signal to the time point at which the measured voltage or current falls within the operating range of the protective relay 300 with a first reference period, and generate correction operation performance information of the protective relay 300 based on the first reference period comparison result. Here, the first reference period may correspond to a pattern of the test signal simulated by the test equipment 200. That is, the calculation unit 160 may further verify the test of the protection relay 300 through the first reference period comparison result.

In addition, the calculation unit 160 may compare a period from the time point at which the switch unit 140 receives the trip signal or the close signal to a time point at which switch unit 140 receives an additional trip signal or close signal with a second reference period, and generate delay operation performance information of the protective relay 300 based on the second reference period comparison result.

In general, since the protective relay 300 consumes some mechanical operation time, the protective relay 300 may perform a delay operation in order to have a cooling time for stable operation. The calculation unit 160 may verify performance of the delay operation through the second reference period comparison result.

As such, the impedance for each of the plurality of time points calculated by the calculation unit 160 may be variously used to generate and analyze the performance information of the protective relay, thereby supporting a test progress of the test coordinator in various aspects.

The display unit 170 may display the impedance trajectory by displaying the impedances calculated by the calculation unit 160 in real time on a coordinate having a resistance component axis R and a reactance component axis X. When the test coordinator knows the impedance trajectory according to the normal operation of the protective relay, the test coordinator may check the impedance trajectory and more smoothly detect the performance information on the protective relay.

Since a reference impedance trajectory according to the normal operation of the protective relay may vary according to the type of the protective relay, the display unit 170 may display the calculated impedance trajectory together with the reference impedance trajectory. Accordingly, even when the test coordinator does not know the impedance trajectory according to the normal operation of the protective relay, the test coordinator may check the impedance trajectory and more smoothly detect the performance information on the protective relay.

The setting unit 180 may receive type information of the protective relay 300 and set the operating range and the reference impedance of the protective relay 300 based on the type information. In addition, the setting unit 180 may receive type information of the test equipment and set a length of the first reference period or a length of the second reference period based on the type information. The first reference period may be 2 seconds, and the second reference period may be 20 seconds, but are not limited thereto.

Accordingly, the protective relay test equipment operation device 100 may improve connection compatibility of the protective relay.

FIGS. 2A through 2C are diagrams illustrating protection ranges according to types of protective relays. Three curves 401, 402, and 403 of FIG. 2A represent the protection ranges of a ratio differential relay, respectively, six polygons 404, 405, 406, 407, 408, and 409 of FIG. 2B represent the protection ranges of a distance relay, respectively, and two circles 410 and 411 of FIG. 2C represent the protection ranges of a field loss relay, respectively.

FIGS. 3A and 3B are diagrams illustrating protection ranges and impedance trajectories of the protective relay.

A rectangular box 412 of FIG. 3A represents the protection range of the protective relay, and a curve 512 of FIG. 3A represents the impedance trajectory. A rectangular box 413 of FIG. 3B represents the protection range of the protective relay, and a curve 513 of FIG. 3B represents the impedance trajectory.

Meanwhile, a horizontal axis of FIGS. 2A, 2B, 2C, 3A, and 3B represents the resistance component axis, and a vertical axis thereof represents the reactance component axis.

The protective relay test equipment operation device according to an exemplary embodiment in the present disclosure may generate the performance information of the protective relay based on impedance of a time point at which the impedance trajectory falls within the protection range.

FIG. 4 is a flowchart illustrating a protective relay test equipment operation method according to an exemplary embodiment in the present disclosure.

Referring to FIG. 4, a protective relay test equipment operation method may include a close signal receiving operation (S110), a connection operation (S120), a measurement operation (S130), an impedance trajectory display operation (S140), a trip signal receiving operation (S150), and an interruption operation (S160), and may be repeated.

In the close signal receiving operation (S110), the protective relay test equipment operation device may receive a close signal from the protective relay.

In the connection operation (S120), the protective relay test equipment operation device may electrically connect between the test equipment generating a test signal and the protective relay as the close signal is received.

In the measurement operation (S130), the protective relay test equipment operation device may measure a voltage and a current between the test equipment and the protective relay.

In the impedance trajectory display operation (S140), the protective relay test equipment operation device may generate and display an impedance trajectory based on the voltage and the current.

In the trip signal receiving operation (S150), the protective relay test equipment operation device may receive a trip signal from the protective relay.

In the interruption operation (S160), the protective relay test equipment operation device may electrically interrupt between the test equipment and the protective relay as the trip signal is received.

Although not illustrated in FIG. 4, the protective relay test equipment operation method according to an exemplary embodiment in the present disclosure may further include an operation of receiving type information of the protective relay, an operation of setting a protection range of the protective relay corresponding to the type information, an operation of calculating a time point or a point at which the generated impedance trajectory meets the protection range, and an operation of generating performance information of the protective relay based on the time point or the point.

FIG. 5 is a flowchart illustrating an internal operation of the protective relay test equipment operation device according to an exemplary embodiment in the present disclosure.

Referring to FIG. 5, the protective relay test equipment operation device may set device operating times such as the first and second reference times described above (S210), receive fault voltage and current such as the test voltage and the test current described above (S220), create an impedance trajectory of the protective relay (S240) according to the impedance calculation (S230), interrupt the voltage and the current (S250) by turning off a switch according to the output of the trip signal (S245) according to an operation of the protective relay (S235), stop the trajectory creation of the protective relay (S260), and receive the voltage and the current again (S280) by turning on the switch according to the output of the close signal of the protective relay (S270).

FIG. 6 is a flowchart illustrating generation of performance information and an impedance trajectory of the protective relay test equipment operation device according to an exemplary embodiment in the present disclosure.

Referring to FIG. 6, the protective relay test equipment operation device may input a correction value (protection range) of the protective relay (S310), display the protection range (S320), input an impedance trajectory of the protective relay by calculating a fault voltage and a fault current (S330), check whether or not a trip signal of the protective relay is input (S340), determine a fault phase by comparing the fault voltage and the fault current with a load current and a load voltage (S350), perform a first reference time comparison and a second reference time comparison (S360), compare whether the fault phase falls within the protection range (S365), output performance information of Success (S370) or output performance information of Fail (S375) according to the comparison result of S360 and S365, and stop a test (S390) when the performance information is output or the trip signal is not input for the second reference time (e.g., 20 seconds).

Meanwhile, the protective relay test equipment operation method may be performed by a computing environment including a processor, a memory, a storage, an input device, an output device, and a communication connection. The input device may receive the close signal or the trip signal, the processor may calculate the impedance trajectory and generate the performance information, the memory may store a calculation method of the processor and store the reference impedance trajectory, and the first and second reference times, the storage may support an update operation of the memory, and the output device may output a control signal to the switch unit or display the impedance trajectory.

In addition, the term '~ unit' used in the present exemplary embodiment refers to software or a hardware component such as a field-programmable gate array (FPGA) or an ASIC, and '~ unit' performs certain roles. However, '~ unit' is not meant to be limited to software or hardware. '~ unit' may be configured to be in an addressable storage medium or may also be configured to reproduce one or more processors. Therefore, as an example, '~ unit' includes components such as software components, object-oriented software components, class components, and task components, processes, functions, attributes, procedures, subroutines, segments of program code, drivers, firmware, microcode, circuitry, data, database, data structures, tables, arrays, and variables. The functions provided within the components and the '· units' may be combined into a smaller number of components and '· units', or further divided into additional components and '· units'. As well, the components and '· units' may also be implemented to reproduce one or more CPUs in a device or a system.

While exemplary embodiments have been shown and described above, it will be apparent to those skilled in the art that modifications and variations could be made without departing from the scope of the present invention as defined by the appended claims.

The invention claimed is:

1. A protective relay test equipment operation device, the apparatus comprising:
a switch unit changing an electrical connection state between a first port configured to be electrically connected to the test equipment generating a test signal and a second port configured to be electrically connected to the protective relay according to a trip signal or a close signal received from the protective relay;
a measurement unit measuring a voltage and a current between the first port and the second port during a test period in which an operation time point of the switch unit is a start time point or an end time point; and
a calculation unit calculating impedance for each of a plurality of time points within the test period according to the measurement result of the measurement unit.

2. The device of claim 1, further comprising a display unit displaying an impedance trajectory by displaying the impedances calculated by the calculation unit in the order of the plurality of time points on a coordinate having a resistance component axis and a reactance component axis.

3. The device of claim 2, wherein the display unit displays the impedance trajectory together with a protection range of the protective relay, and
the calculation unit generates performance information of the protective relay based on impedance of a time point at which the impedance trajectory meets the protection range.

4. The device of claim 1, wherein the calculation unit compares impedance of a time point of the plurality of time points at which the voltage or the current falls within an operating range of the protective relay with reference impedance, and generates performance information of the protective relay based on the reference impedance comparison result.

5. The device of claim 4, further comprising a setting unit receiving type information of the protective relay and setting the operating range of the protective relay and the reference impedance based on the type information.

6. The device of claim 1, wherein the calculation unit compares a period from a time point at which the switch unit receives the trip signal or the close signal to a time point at which the voltage or the current falls within an operating range of the protective relay with a first reference period, and generates correction operation performance information of the protective relay based on the first reference period comparison result.

7. The device of claim 6, wherein the calculation unit compares a period from the time point at which the switch unit receives the trip signal or the close signal to a time point at which the switch unit receives an additional trip signal or close signal with a second reference period, and generates delay operation performance information of the protective relay based on the second reference period comparison result.

8. The device of claim 7, further comprising a setting unit receiving type information of the test equipment and setting a length of the first reference period or a length of the second reference period based on the type information.

9. The device of claim 1, further comprising a second switch unit changing an electrical connection state between a third port configured to be electrically connected to the protective relay and the first port as the trip signal or the close signal is received,
wherein the second port and the third port are configured to be connected to different types of connection terminals.

10. A protective relay test equipment operation method, the method comprising:
receiving a close signal from the protective relay;
electrically connecting between the test equipment generating a test signal and the protective relay as the close signal is received;
measuring a voltage and a current between the test equipment and the protective relay;
generating or displaying an impedance trajectory based on the voltage and the current;
receiving a trip signal from the protective relay; and
electrically interrupting a signal between the test equipment and the protective relay as the trip signal is received.

11. The method of claim 10, further comprising:
calculating a time point or a point at which the impedance trajectory meets a protection range of the protective relay; and
generating performance information of the protective relay based on the time point or the point.

12. The method of claim 11, further comprising:
receiving type information of the protective relay; and
setting the protection range corresponding to the type information.

* * * * *